United States Patent [19]

Southward et al.

[11] Patent Number: 5,745,580

[45] Date of Patent: Apr. 28, 1998

[54] REDUCTION OF COMPUTATIONAL BURDEN OF ADAPTIVELY UPDATING CONTROL FILTER(S) IN ACTIVE SYSTEMS

[75] Inventors: Steve C. Southward, Cary; Lane R. Miller, Fuquay-Varina, both of N.C.

[73] Assignee: Lord Corporation, Cary, N.C.

[21] Appl. No.: 334,467

[22] Filed: Nov. 4, 1994

[51] Int. Cl.$^6$ .............................. A61F 11/06; H03B 29/00
[52] U.S. Cl. ................................. 381/71; 381/94
[58] Field of Search ................... 381/71, 94; 415/119; 267/136

[56] References Cited

U.S. PATENT DOCUMENTS

| | | |
|---|---|---|
| 4,083,433 | 4/1978 | Geohagen et al. |
| 4,122,303 | 10/1978 | Chaplin et al. |
| 4,153,815 | 5/1979 | Chaplin et al. |
| 4,232,381 | 11/1980 | Rennick et al. |
| 4,417,098 | 11/1983 | Chaplin et al. |
| 4,473,906 | 9/1984 | Warnaka et al. |
| 4,562,589 | 12/1985 | Warnaka et al. |
| 4,677,676 | 6/1987 | Eriksson. |
| 4,677,677 | 6/1987 | Eriksson. |
| 4,689,821 | 8/1987 | Salikuddin et al. |
| 4,878,188 | 10/1989 | Ziegler, Jr. |
| 5,133,527 | 7/1992 | Chen et al. |
| 5,170,433 | 12/1992 | Elliott et al. |
| 5,174,552 | 12/1992 | Hodgson et al. |
| 5,206,911 | 4/1993 | Eriksson et al. |
| 5,216,721 | 6/1993 | Melton. |
| 5,216,722 | 6/1993 | Popovich. |
| 5,416,844 | 5/1995 | Nakaji et al. ................. 381/71 |

*Primary Examiner*—Curtis A. Kuntz
*Assistant Examiner*—Minsun Oh
*Attorney, Agent, or Firm*—Randall S. Wayland; Richard K. Thomson

[57] ABSTRACT

An active control method and apparatus for controlling vibration or sound wherein the computational burden to adaptively update the control filter within the update model is reduced. The apparatus includes means for producing an input signal for input to the update model and the reduction block, means for generating an error sensor, and an output device for canceling sound and/or vibration at a selected location. The method uses a gradient descent algorithm such as the filtered-x LMS algorithm and replaces the long filter model with a shortened length filter model. Error signal information together with the output information from the shortened length filter model are used to update the coefficients of the control filter according to an update calculation method. The shortened filter model only contains frequency response information at the L frequencies of interest. Because of the reduced amount of information contained in the shortened filter model, more updates per unit of time can be performed on the control filter(s) or a smaller or fewer processors or CPU's may be utilized. The method has applicability to feed-forward and feed-back type systems and also to systems using a waveform generator for supplying the input signal. The reduction method may be implemented on-line or off-line.

20 Claims, 7 Drawing Sheets

Fig. 1 "Prior Art"

REDUCTION OF COMPUTATIONAL BURDEN OF ADAPTIVELY UPDATING CONTROL FILTER(S) IN ACTIVE SYSTEMS

FIELD OF THE INVENTION

This invention relates to the area of active control methods and apparatus for control of noise and vibration. Specifically, the invention relates to means and apparatus for adaptively updating one or more control filters used in active noise and/or vibration control systems.

BACKGROUND OF THE INVENTION

Active vibration isolation and sound isolation systems inject active forces and/or acoustic noise to effectively cancel noise and/or vibration at one or more defined locations. Hereafter, in the description, the plural will be used as meaning one or more. The noise and/or vibration emanates from a source of disturbance such as an engine. These active systems utilize microprocessors to calculate the appropriate response to eliminate, or at least to substantially minimize, mechanical vibration or ambient noise levels. Typical examples of active systems include systems which reduce noise and/or vibration experienced within an aircraft cabin or within an automobile passenger compartment. Generally, these active control systems are responsive to at least one input or reference signal and/or an error sensor signal. Typical devices for supplying these reference and error signals include microphones, accelerometers, force sensors, and the like.

Examples of active systems are taught in U.S. Pat. Nos. 4,677,676 and 4,677,677 to Eriksson, the disclosures of which are hereby incorporated by reference herein. Further examples include U.S. Pat. Nos. 4,417,098, 4,153,815 and 4,122,303 to Chaplin et al., 4,232,381 to Rennick et al., 4,083,433 to Geohegan, Jr. et al., 4,878,188 to Ziegler, Jr., 4,562,589 and 4,473,906 to Warnaka et al., 5,170,433 to Elliott et al., 4,689,821 to Salikuddin et al., 5,174,552 to Hodgson, and 5,133,527 to Chen et al. In these types of active systems, the algorithm used for control can be least mean square (LMS), Filtered-X LMS, Filtered-U, Newton's Raphson method, or other like gradient descent methods. For background, the Filtered-x LMS algorithm is described herein.

Filtered-x LMS Algorithm Background

In active control systems, control filters such as finite impulse response (FIR) filters or infinite impulse response (IIR) filters are used. For example, a filtered-x system will include at least one control filter and at least one x-filter. The x-filter models the frequency response of the plant whereas the control filter transforms the input or reference signal into an output signal for driving an output device. In a single-input single-output (SISO) system illustrated in FIG. 1 utilizing the Filtered-x Least Means Square (LMS) algorithm, there is a feed-forward control filter $A_{N,k}$ and an x-filter $C_M$. The x-filter information $R_k$ and error signal $e_k$ information from an error sensor are used in an update calculation method utilizing an equation such as: $A_{k+1} = A_k - \mu e_k R_k$. The result of the update calculation method is used to adaptively update the coefficients or taps of the feed-forward control filter $A_{N,k}$ as indicated by the arrow. The Filtered-x LMS algorithm is fully described in "Adaptive Signal Processing" by B. Widrow and S. D. Steam, 1985.

"Prior Art" On-Line Identification System

FIG. 2 illustrates an active control system of the prior art which includes on-line identification of the x-filter model. This method is fully described in relation to FIG. 20 of U.S. Pat. No. 4,677,676 to Eriksson. Utilizing the numerals used in the '676 patent for reference, the Eriksson invention provides an active attenuation system and method for attenuating an undesirable acoustic wave by producing a canceling output acoustic wave from an output transducer 14. The key is that the invention models the feedback path 20, error path 56 and the output transducer 14 in an on-line fashion. In essence, the pre-training step previously required was eliminated, such that the active system may update itself for changes in the dynamic system due to temperature, etc.

The acoustic system is modeled by adaptive filter model 40 provided by filters 12 and 22 and having a model input at 42. The model 40 outputs a correction signal at 46 to the output transducer 14 to introduce a correction signal to drive the error signal 44 to zero. The auxiliary noise source 140 introduces noise into the adaptive filter model 40. The noise source is a low level random uncorrelated noise source. Model 142 models the error path 56 on-line. A copy of S'E' is copied to 144 and 146 to compensate for the output transducer 14 and the error path 56. The error signal 44 is used with the output of the copy 144 and 146 at junctions 72 and 76 to provide update signals to the A and B filters. The novel feature of this invention is that it requires no calibration, no pre-training of weights, and no start-up procedure as all updates are achieved on-line.

"Prior Art" MIMO Systems

In multiple-input multiple-output (MIMO) systems such as described in U.S. Pat. No. 5,216,722 to Popovich and U.S. Pat. No. 5,216,721 to Melton, the disclosures of which are hereby incorporated by reference herein, a feed-forward control filter is associated with each reference sensor/output device pair. Also, there is one x-filter associated with each output device/sensor pair. The coefficients or tap weights of each feedforward control filter must be calculated and updated in real time.

A typical MIMO system would have $N_a$ output devices, $N_s$ error sensors, and $N_r$ reference sensors. As a result, there will be $(N_a \times N_r)$ control filters and $(N_a \times N_s)$ x-Filters. For example, systems utilizing 16 error sensors, 16 reference sensors, and 16 output devices, such as might be found in a typical MIMO system, there will be 256 control filters and 256 x-filters. Each of the x-filter models may be developed on-line or off-line by pre-training and represents an estimate of the impulse response between each corresponding error sensor and output device. A matrix of information from the reference sensors is input into the x-filters. The x-filter output information is then used, along with the error sensor matrix information, to calculate the updated coefficients for each of the feed-forward control filters according to an update method. Again, this is known as adaptively updating the control filter tap weights.

Typically, the x-filters are such that they model the plant over the entire frequency range of interest. Because of this, a large stream of frequency response information is developed to model the plant over this wide frequency range. These data streams may include hundreds of samples. As a result, the amount of information provided to the update calculation from the x-filters can be enormous. This results in the need for very fast, expensive microprocessors, or multiple microprocessors or CPU's to provide the required computing power to be able to update the control filter coefficients adequately. Because the computational burden for MIMO systems is so large, typically the control filters are only updated in a round-robin fashion.

3

In other words, not all the control filters are updated each update cycle in MIMO systems. For example, only two control filters may be updated each update cycle, and a different two control filters are updated the next cycle. As should be apparent, the computational burden becomes very large for MIMO systems, and as a result, adaptively updating of the feed-forward control filters cannot be accomplished very frequently. This causes both the convergence time and the level of noise/vibration cancellation achievable to suffer.

SUMMARY OF THE INVENTION

The present invention provides the method and apparatus for reducing the computational burden required to update control filters in an active control system by reducing the size of the filter models that are used for providing information to the update calculation method. For example, in x-filter systems, reducing the length, i.e., the size, of the x-filters allows a system to adapt to changes in the error path more effectively and quickly. In another aspect of the present invention, the reduction technique for reducing the size of the models takes place in an on-line fashion within a reduction block. This method and apparatus has particular applicability for systems having four or less discreet and dominant tones, i.e., tonal systems. However, the apparatus and method may also be used in systems having many tones.

For x-filter systems, this method reduces the length of the x-filters and therefore reduces the computational burden required of the microprocessor to perform the update calculation to update the control filters. These reduced or shortened x-filter models can have up to 25 times fewer values than prior art long x-filter models. This is especially true in tonal systems having a few discreet and dominant tones to be controlled. Fewer values means reduced number of calculations are required to adaptively update the control filters. Because of the shortened length, more updates per unit of time can be achieved, thus providing better control of noise and/or vibration, or in the alternative, allowing the use of smaller and less expensive micro-processors or a smaller number of microprocessors. Of course all of the above making reference to filtered-x feed-forward systems have applicability to feed-back type systems also, as will be described later. Further, the present invention reduction method has applicability in MIMO systems as well.

The key to the present invention is that the long filter models are transformed into shortened or reduced filter models within the reduction block. The reduction method has particular applicability in tonal systems that contain four or less discreet and dominant tones. As a result of the smaller dimensional size, the calculations required to update the coefficients of the control filters are reduced correspondingly. For example, in x-filter systems, the long x-filter models are transformed into short x-filter models which contain the frequency response information only at L frequencies of interest. In most aircraft control systems, there may only be L=2 to L=4 dominant tones of interest. By extracting the frequency response estimates only at these L selected tones, and ignoring the other frequency response information, the length (size) of the x-filters can be dramatically reduced. Typical prior art frequency response models, i.e., long filter models may contain approximately 60 to 100 weights, whereas the reduced filter models may only require approximately 4 to 8 weights.

The shortened filter models can be obtained by a relatively simple calculation to be described in detail. Additionally, the shortened or reduced filter updates may be implemented in an on-line fashion such that the reduced filter models can be determined without shutdown and without off-line pre-training. Apparatus are described herein for reducing the filter models in an on-line fashion for both MIMO systems and SISO systems, as well as for feed-forward and feed-back type systems. Further, the on-line reduction method and apparatus may be used for feed-forward systems that utilize a synchronization signal and a waveform generator.

The above-mentioned and further novel aspects and advantages of the present invention will become apparent from the accompanying descriptions of the preferred embodiments and attached drawings.

BRIEF DESCRIPTION OF THE DRAWINGS

The accompanying drawings which form a part of the specification, illustrate several embodiments of the present invention. The drawings and description together, serve to fully explain the invention. In the drawings.

DETAILED DESCRIPTION OF THE INVENTION

In the following, it should be understood that the present invention may be used in systems for controlling acoustic vibrations in air as well as mechanical vibrations in gases, liquids, or solids. In summary, the present invention provides a method and apparatus for transforming a long filter model into a shortened or reduced filter model, thus reducing the computational burden required to update the control filters. The present invention is ideally suited, and is applicable to, tonal active control systems where one to four tones may be present and controlled. The term "tone" refers to the frequency of the mechanical vibration or noise.

Figure 1:
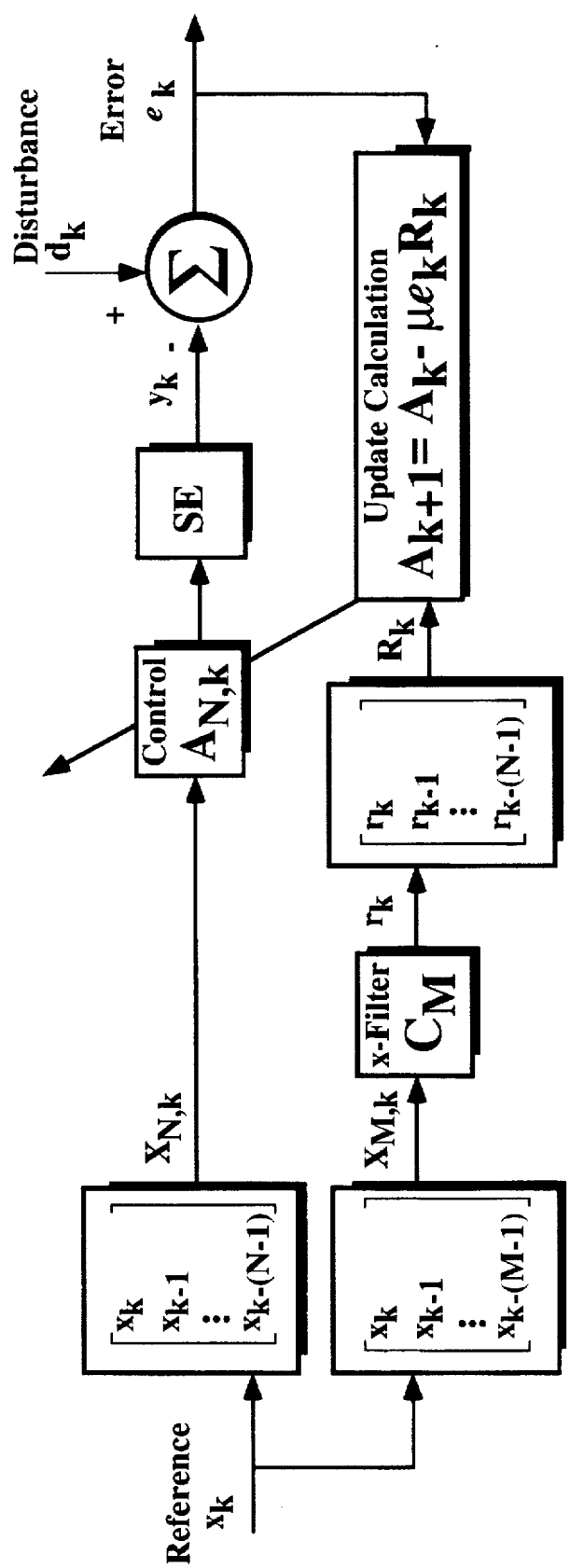
FIG. 1 is a block diagram illustration of a filtered-x active attenuation system known in the prior art.
Figure 2:
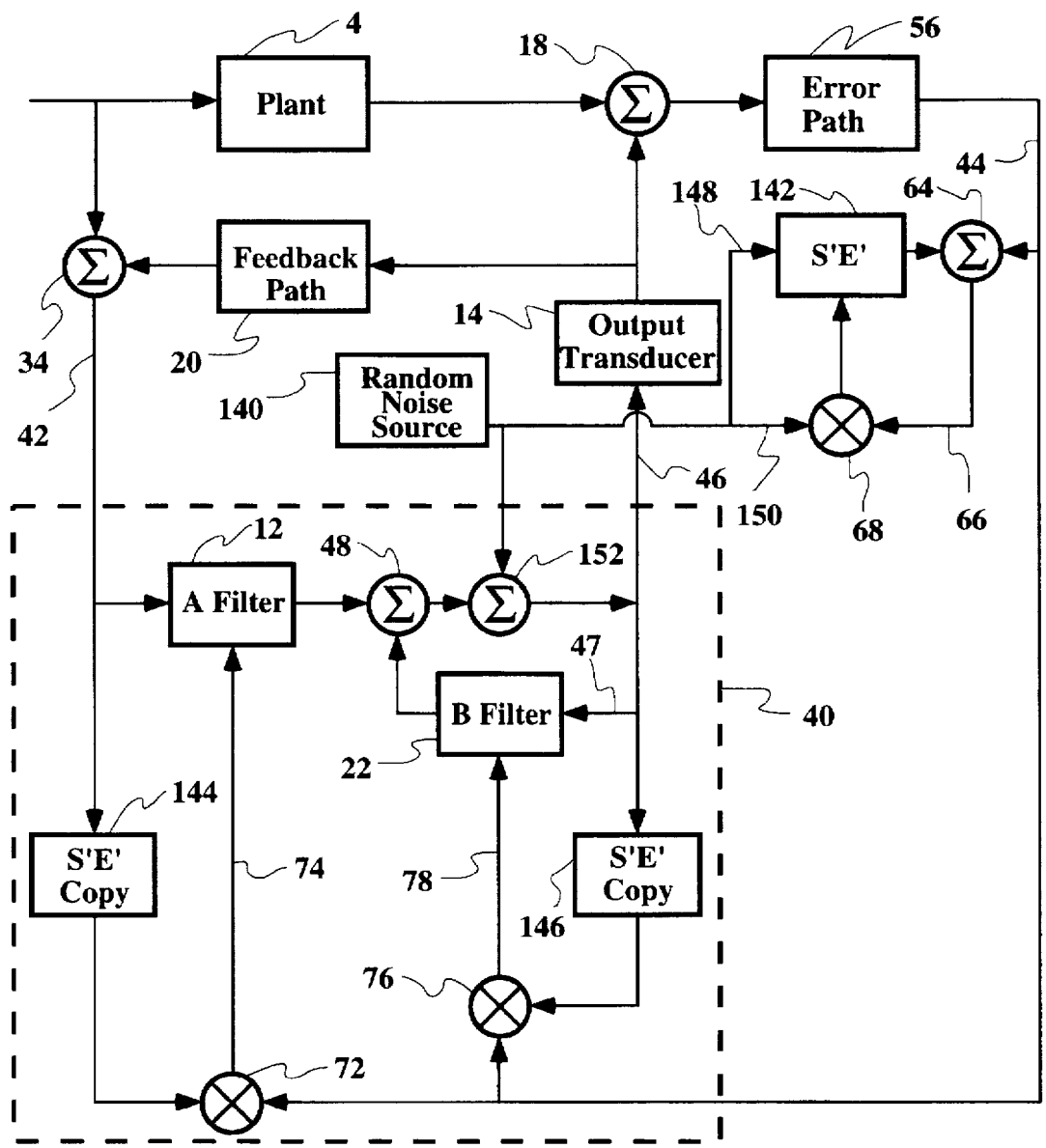
FIG. 2 is a schematic illustration of an active attenuation system with on-line feedback, error path, and output transducer modeling known in the prior art.
Figure 3:
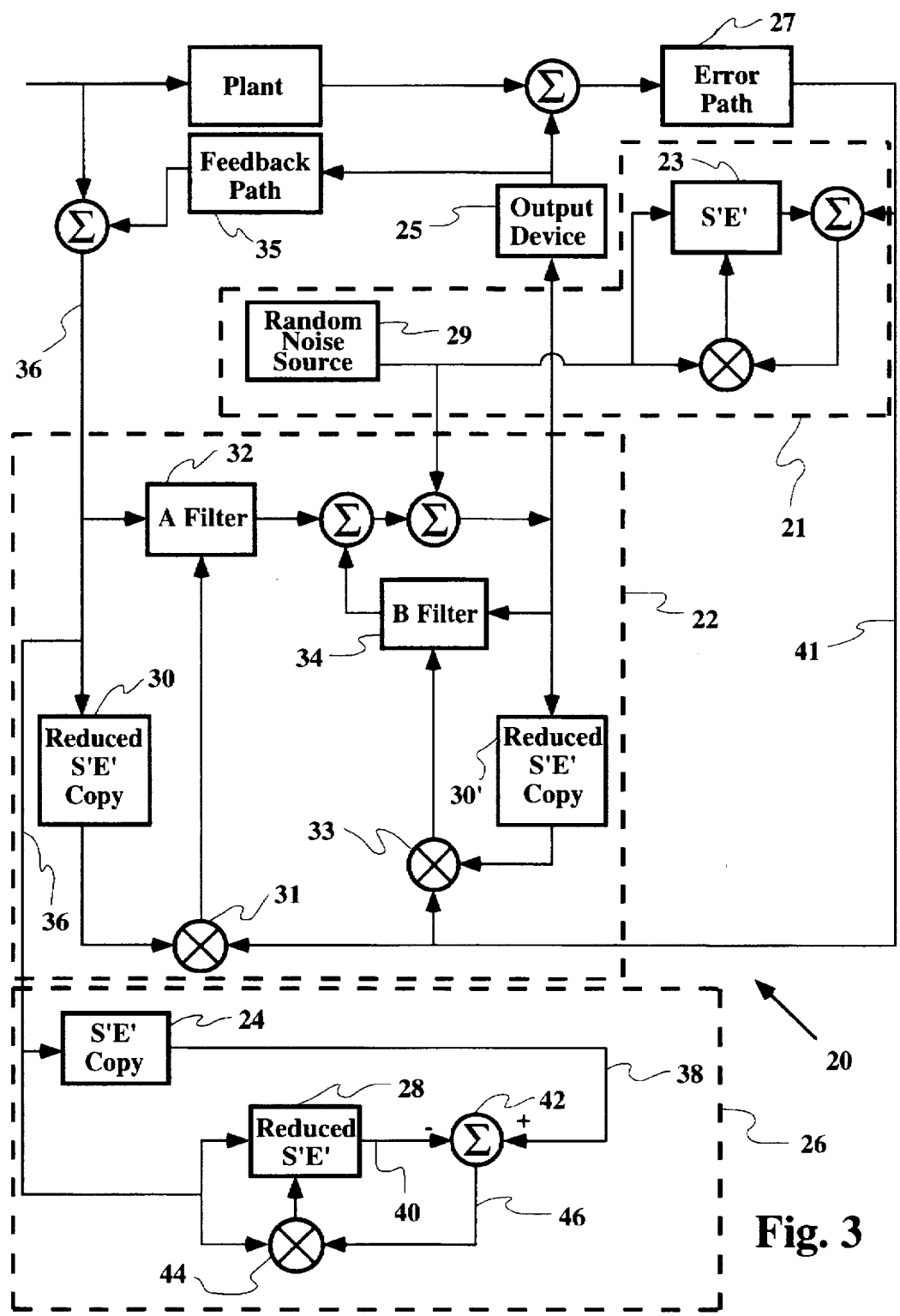
FIG. 3 is a schematic illustration of an active attenuation apparatus and system of the present invention including an on-line reduction of the long filter model in a feed-forward system.

FIG. 3 illustrates one embodiment for carrying out the filter model reduction method. In this aspect of the present invention the reduction method is accomplished in an on-line fashion in reduction block 26. The active system 20 is used to cancel either a vibration or a sound and includes an update model 22 wherein the A Filter 32 and B-Filter 34 are adaptively updated to provide an output signal to an output device 25 in order to cancel a disturbance (the disturbing noise or vibration). Optionally, the system 20 may also include on-line identification block 21 including on-line means for extracting an S'E' model 23. The S'E' model 23, i.e., the long filter model, is an estimate of the frequency response of the plant across the frequency range of interest.

Basically, this is the long filter model $B_K$ which will be described in the method to follow. This system 20 uses random low-level uncorrelated noise from random noise source 29 to develop the S'E' model 23 on-line. The S'E' model 23 is a model of the error path 27 and the output device 25. However, it should be noted that the S'E' model 23 could be optionally developed off-line by pre-training allowing elimination of identification block 21.

Once obtained, the S'E' model 23 is then copied and used in the novel on-line reduction process of the present invention taking place at reduction block 26. Within the reduction block 26, the input signal 36 is input into the reduced S'E' model 28 and to the S'E' copy 24. The input signal 36 in this embodiment is the signal that goes to both the A Filter 32 and also to the reduction block 26. This convention for the input signal is the same for all of the embodiments to follow. The output from the S'E' model copy 24 is transferred through line 38 and is summed (according to the sign convention shown) with the output from the reduced S'E' model 28 from line 40 at summing junction 42. The output from the summing junction 42 is input into convergence method 44 via line 46. Ideally, once the signal at 46 is zero or near zero, the reduced S'E' model 28 may be copied to reduced S'E' Copy blocks 30 and 30' to be used in the update of the A Filter 32 and B Filter 34 within the update model 22. The error information 41 and the output from the reduced S'E' model copies 30 and 30' are used for update of the A Filter 32 and B Filter 34 models. It should be noted that the update calculation method which calculates the coefficients or weights for the A filter 32 and B filter 34 at adaptation junctions 31 and 33 may be suspended to allow the reduction method of the reduction block 26 to converge and arrive at the reduced S'E' model 28. The reduced S'E' model 28 contains the exact same frequency response as the S'E' model 23, but only at the L number of discreet frequencies of interest, i.e., the tones to be controlled.

In the FIG. 3 embodiment, the apparatus obtains the input signal 36 from a reference sensor (not shown) for sensing a source of input disturbance and providing an input signal indicative of the input disturbance. The input disturbance causes at least one of a vibration and noise to occur within a control volume (not shown). An output device 25 is used to provide a canceling output for locally canceling at least one of said vibration and noise at the defined location of the control volume. An error sensor (not shown) for sensing a residual combination of at least one of noise and vibration due to the canceling output and the input disturbance produces an error signal 41. An update model 22 is provided for transforming said input signal 36 into a canceling output which is transmitted to the output device 25. The control filter(s) 32 and 34 include a plurality of control filter weights to be updated. An x-filter S'E' model 23 is used for providing a frequency response estimate of the dynamic system or plant which is used in the reduction method. Finally, means are provided in reduction block 26 for shortening the x-filter S'E' model 23 such that the shortened or reduced filtered-x model 28 has a smaller number of coefficients that match the frequency response of a plant at a finite number L of distinct disturbance frequencies. The smaller number of coefficients are used in an update-calculation method at junctions 31 and 33 which may incorporate a method such as filtered-x LMS, for adaptively updating the control filter weights of the control filter(s) 32 and 34. As a result of the fewer calculations needed, the updates to the A Filter 32 and B Filter 34 may be made more often or smaller CPU's may be utilized.

The computational reduction is accomplished by a reduction method taking place in reduction block 26 whereby first an estimate of the plant or frequency response is obtained, i.e., the S'E' model 23. This estimate is referred to in this method as the long x-filter model $B_K$. This can be done by exposing the system to an impulse function, random noise, or sine sweep and recording the response in an off-line or on-line fashion. The off-line procedure is known as pre-training and generates a model of the frequency response of the plant over a wide frequency range.

Further, the long x-filter model $B_K$ may be initially obtained and also updated by on-line techniques, such as in on-line identification block 21, where low level random uncorrelated noise from random noise source So 29 is input to the dynamic system and the frequency response is recorded. On-line updating is preferred for systems which the plant varies as a function of time, temperature, etc. Off-line pretraining may be appropriate where the system response characteristics are unchanging. For prior art filtered-x LMS systems, the output of the long x-filter model $r_k$ is then used directly in an update calculation method to calculate the updated feed-forward control filter weights.

In the present invention, rather than using the output information $r_k$ from the long x-filter $B_K$ directly, where the long filter model $B_K$ has a length K, the long x-filter model $B_K$ is transformed by a reduction method or technique into a reduced or shortened x-filter model $D_M$ which has a length of M. In particular, in tonal systems where the method is preferable, there are a discreet number of dominant tones, where M<K and typically, M<<K.

The method of transformation will be illustrated with respect to a single input single output (SISO) system, but has equal applicability to MIMO systems where a distinct number of dominant tones are to be controlled. It should be noted that the advantage of the present invention method and apparatus will diminish as the number of frequencies of interest increases. The output vector $Y_J$ consists of J consecutive samples from the long x-filter model $B_K$ is described as $$Y_J = [y_k, y_{k-1}, \ldots, y_{k-(J-1)}]^T.$$

where:

$y_k$=individual sample output and $Y_J$ is obtained through on-line or off-line methods. $Y_J$ could then be used to calculate the shortened or reduced filter model 28 according to the following $$D_M = [H_{J,M}^+] Y_J$$

However, in practice, one would extract $B_K$ first, which is an estimate of the plant. Then, an equivalent shortened or reduced x-filter model $D_M$ would be constructed from the long x-filter model $B_K$. First, the matrix $[H_{J,K}]$ would be generated by extracting a collection of inputs at 36. $[H_{J,K}]$ represents a Hankel matrix which is a collection of row vectors, each row being a buffer of input data. In a feed forward system, the data may be collected from the reference sensor (not shown). In a feed-back type system, the input includes the error information. It should be understood that any appropriate input may be used to construct the Hankel Matrix. K represents the length of the long filter model $B_K$. Next, $[H_{J,M}]$ would be extracted, as a subset of $[H_{J,K}]$. This is accomplished by taking the M left-most columns of the $[H_{J,K}]$ matrix. Next, one would complete or perform an inverse of $[H_{J,M}]$. The inverse is denoted $[H_{J,M}^+]$. Methods of developing inverses are known, such as taught in Matrix Computations by Golub and Van Loan, Johns Hopkins University Press, 1983.

As mentioned above, the solution may be arrived at by calculating $Y_J$ as follows:

$$Y_J=[H_{J,M}]D_M=[H_{J,K}B_K]$$

where:

$$H_{J,M}=[X_{M,k}X_{M,k-1}\ldots X_{M,k-(J-1)}]^T$$

The solution to the equation above is the vector of coefficients $z_k$ of the short x-filter $D_M$ which can model the output response only at the L distinct, unique, and dominant tones present in the reference signal $x_k$.

Two forms of the generalized solution which require a pseudo inverse operation are as follows:

1st Form $D_M=[H_{J,M}^+H_{J,K}]B_K$

2nd Form $D_M=[H_{J,M}^+]Y_J$

These two forms are known as pseudo inverse methods where the generalized inverse (superscript+) is used to describe all solutions including cases where the actual inverse does not exist. When an actual solution does exist, for example, when $[H_{J,M}]$ is non-singular, the shortened x-filter model $D_M$ and the $B_K$ long x-filter model will produce exactly the same output for the same input, but only at the L frequencies or dominant tones present in the reference signal $x_k$. L is a user selected input that depends on the number of dominant tones present in the disturbance.

For the first form, once $[H_{J,M}^+]$ and $[H_{J,K}]$ are computed, their product is multiplied by $B_K$. Updates to $[H_{J,M}^+]$ and $[H_{J,K}]$ are needed only when there is a change to the system. The short model $D_M$ contains far fewer than K terms present in the long x-filter model $B_K$ for tonal systems. The first form is more desirable. The final step is to calculate the control filter weights for updating the A and B Filters 32 and 34, preferably according to a gradient descent update method based upon $D_M$ and the error signal $e_k$. In general, the ideal relationship for a tonal system is found to be where:

$$2L \leq M < K$$

The second form may also be used but is more computationally intensive.

In particular, the present invention is a reduction method for reducing the computational burden of an active control system which uses any gradient descent control algorithm and which uses an estimate of the plant such as S'E' model 23. The reduction method has particular utility in systems using a filtered-x LMS algorithm. The method involves the steps of extracting an input signal $x_k$ at 36, such as in a feed-forward system, indicative of characteristics of a source of disturbance. Next, an error signal 41 having magnitude $e_k$ indicative of a residual disturbance at a selected location is extracted.

The reference signal $x_k$ is fed into a feed-forward control filter 32 for generating a control signal $u_k$. The output signal $u_k$ is fed to an output device 25 to cancel the disturbance, that is, to minimize the magnitude $e_k$ of error signal 41. It is notable that the B Filter 34 may not be needed if the feed-back path 35 is not significant. The feed-forward control filter 32 within the update model 22 has a plurality of control filter weights which are adaptively updated according to an update calculation method taking place at 31. The update-calculation method may be filtered-x LMS or the like.

The transformation step taking place at reduction block 26 involves transforming the long x-filter S'E' model 23 having a length of K into a shortened or reduced x-filter model 28 having a length of M, where M is less than K. Typically, the long filter model $B_K$ (the S'E' model 23) will model the plant over a wide frequency range, for example, from 100 Hz to 400 Hz and may include 60–100 w weights. The shortened x-filter model may only include 2–6 weights if the input only contains one or two tones to be canceled. Inputting the input signal 36 into said shortened x-filter model 28 generates output 40.

This output 40 is then used to converge the reduced filter model 28 by comparison with the output of the S'E' model 23 at the frequencies of interest. Then a copy 30 of the reduced filter model 28 is used to calculate the control filter weights of the feed-forward control filter 32 according to the update-calculation method at 31. The update-calculation method at 31 uses both the shortened x-filter copy 30 output together with the error signal 41. Finally, an output device 25 is driven responsive to the control signal $u_k$ in order to reduce at least one of vibration and sound at a selected location.

The input signal at 36 in this embodiment is generated by a sensor such as at least one of a microphone, accelerometer, force transducer, and a tachometer, or the like. The error signal 41 in this embodiment may be generated by a sensor which can be at least one of a microphone, accelerometer, force transducer, or the like. Finally, the output signal is provided to an output device 25 that may be at least one of a loudspeaker, inertial actuator, active mounting, and electro-mechanical actuator, or the like. This reduction method has particular utility in controlling noise and vibrations from sources having two dominant tones such as an aircraft turbofan engine. The first tone emanates from the low pressure turbine and the second from the high pressure turbine. The method is also useful for controlling 4 dominant tones in a turboprop aircraft.

Figure 4A:
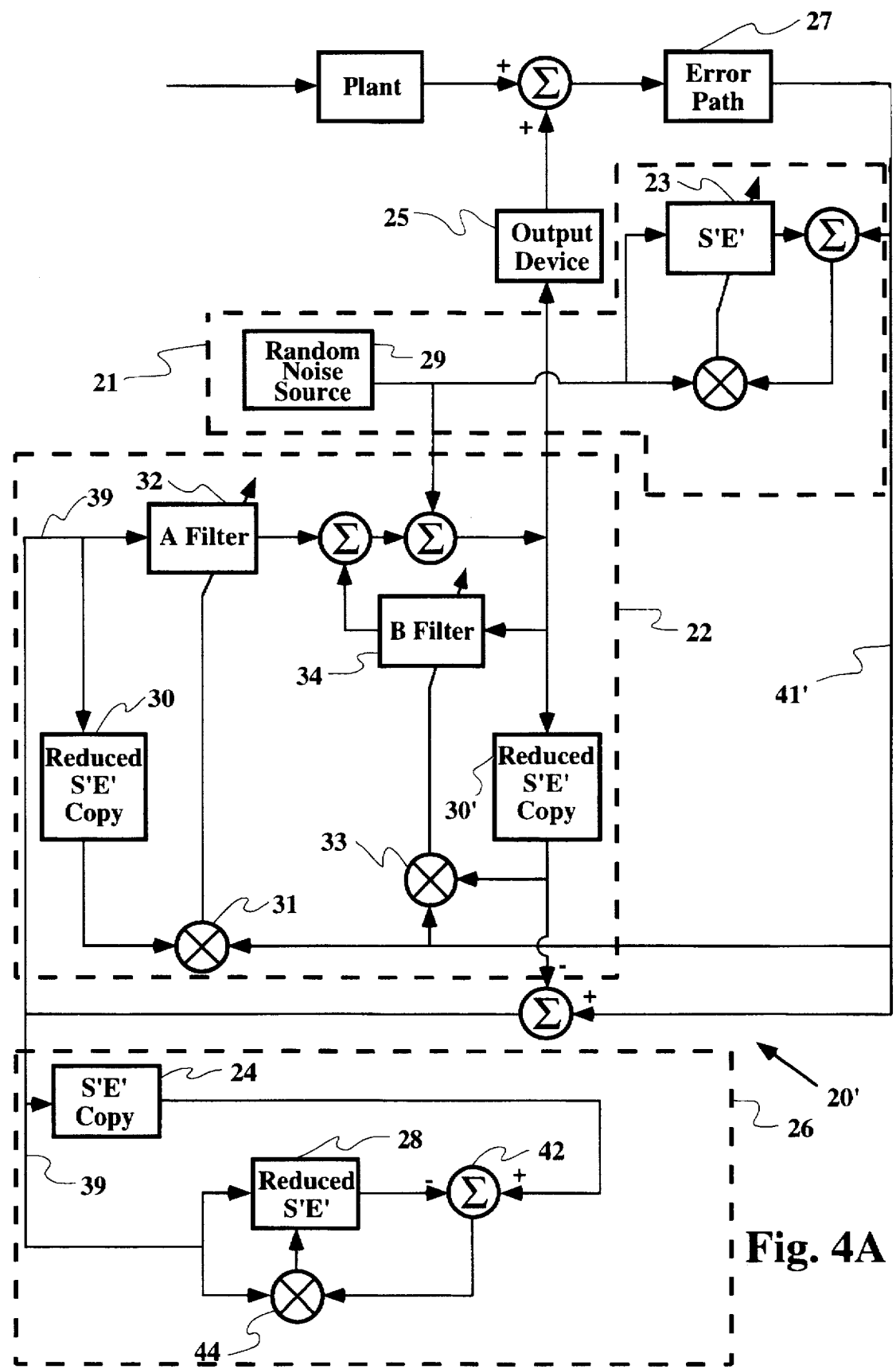
FIG. 4A is a schematic illustration of an active attenuation system including on-line reduction of the filter model in a feed-back type control system (lacks a reference sensor)

FIG. 4A illustrates an active system 20' of the feed-back type. It is generally referred to as a feed-back type because there is no reference sensor present or needed in this embodiment. The system and apparatus utilizes the on-line reduction method of the present invention in the environment of a feed-back type system to obtain a reduced S'E' model 28 which is then used in the adaptation process at junctions 31 and 33. The on-line reduction is implemented in conjunction with the feed-back type system taught in U.S. Pat. No. 5,206,911 to Eriksson, the disclosure of which is hereby incorporated by reference herein. As in the feed-forward system of FIG. 3, the system 20' may include on-line identification block 21 for extracting an S'E' model 23 indicative of the error path 27 and the output device 25. Alternatively, the S'E' model 23 may be obtained with off-line pre-training and block 21 may be eliminated. In the FIG. 4A embodiment, the system 20' is identical to the system in FIG. 3 except that the FIG. 4A does not include a reference input, i.e., it is a feed-back type system. The input signal 39 for this embodiment is input into the A Filter 32 of the update model 22 and also to the reduction block 26. Note, the input signal 39 is derived from error signal 41' and the output from the reduced S'E' copy 30'.

The on-line identification block 21, the update model 22, and the reduction block 26 are the same as in FIG. 3. Upon determining the S'E' model 23 and copying it to the S'E' Copy 24, convergence at junction 44 will result in a reduced S'E' model 28 which matches the frequency response of the S'E' model 23 at the distinct frequencies of interest. Therefore, the reduced S'E' model 28 includes less information than the S'E' model 23. This is particularly true if the plant is dynamically dense or complex, for example, where the plant includes many resonances. The reduced S'E' model 28 is then copied to reduced copy models 30 and 30' which are used for adaptively updating the coefficients of the A filter 32 and the B filter 34. The input 39 to the reduction block 26 is the combination of the error signal 41' and the output of the reduced S'E' Copy 30'. The input signal 39 is directed to both the reduction block 26 and the update model 22.

Figure 4B:
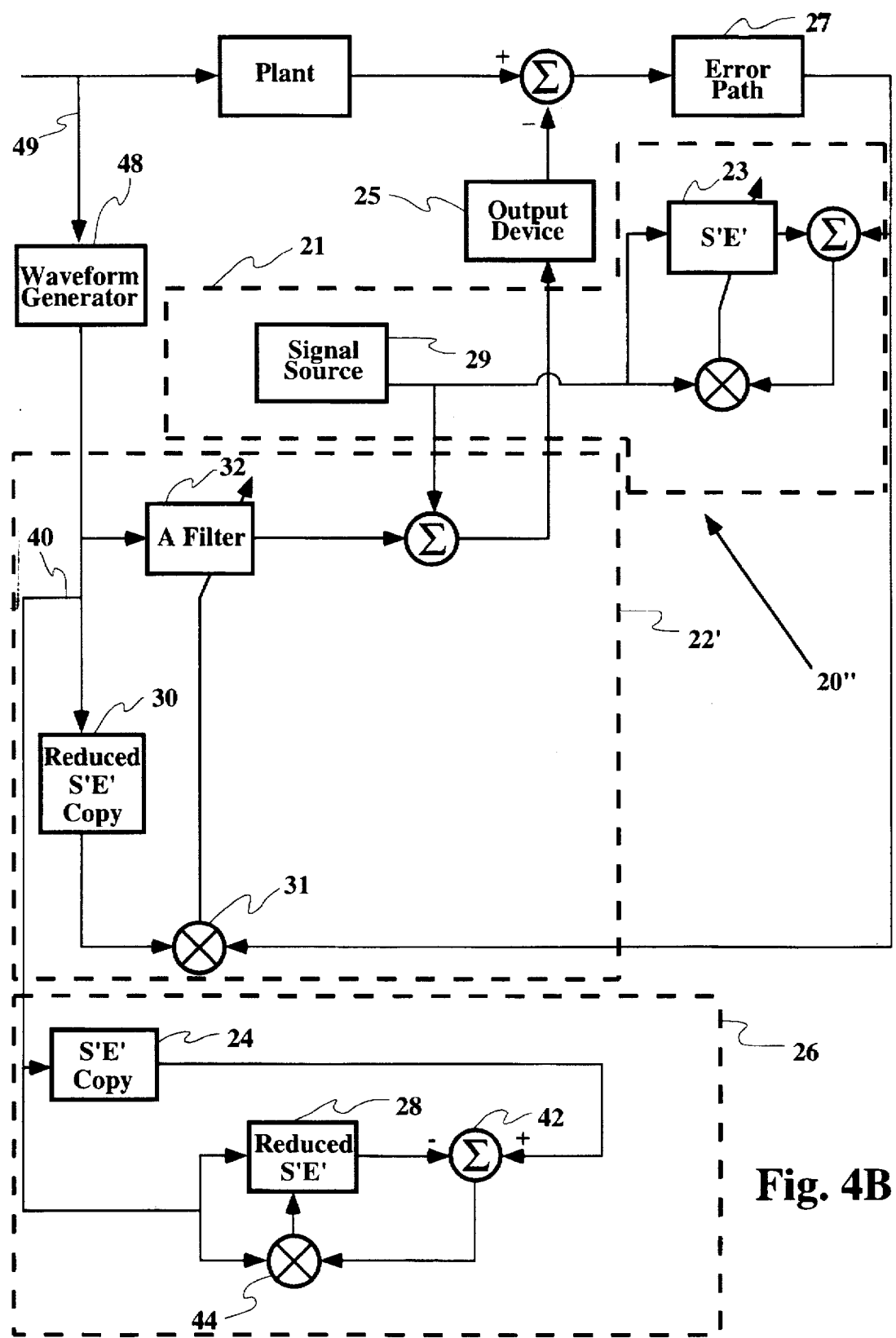
FIG. 4B is a schematic illustration of an active attenuation system including on-line reduction which includes a reduced filter model in a feed-forward control system which utilizes a waveform generator and synchronization signal.

FIG. 4B illustrates an active system 20" including a feed-forward system and apparatus utilizing the on-line reduction technique of the present invention. In this particular embodiment, the feed-forward system includes a waveform generator 48 for generating at least one sinusoidal input signal at 40. The waveform generator 48 receives a synchronization signal 49 which contains the frequency content of the disturbance. This synchronization signal 49 may include multiple dominant and discreet tones. By using on-line reduction block 26, the filter model S'E' 23, which contains frequency response information across the entire range, may be reduced in complexity and size. Therefore, updating of the coefficients of the A filter 32 is less computationally intensive. The method is essentially the same as the FIG. 4A and FIG. 3 embodiments except that the input signal 40 is the output of the waveform generator 48.

Figure 5A:
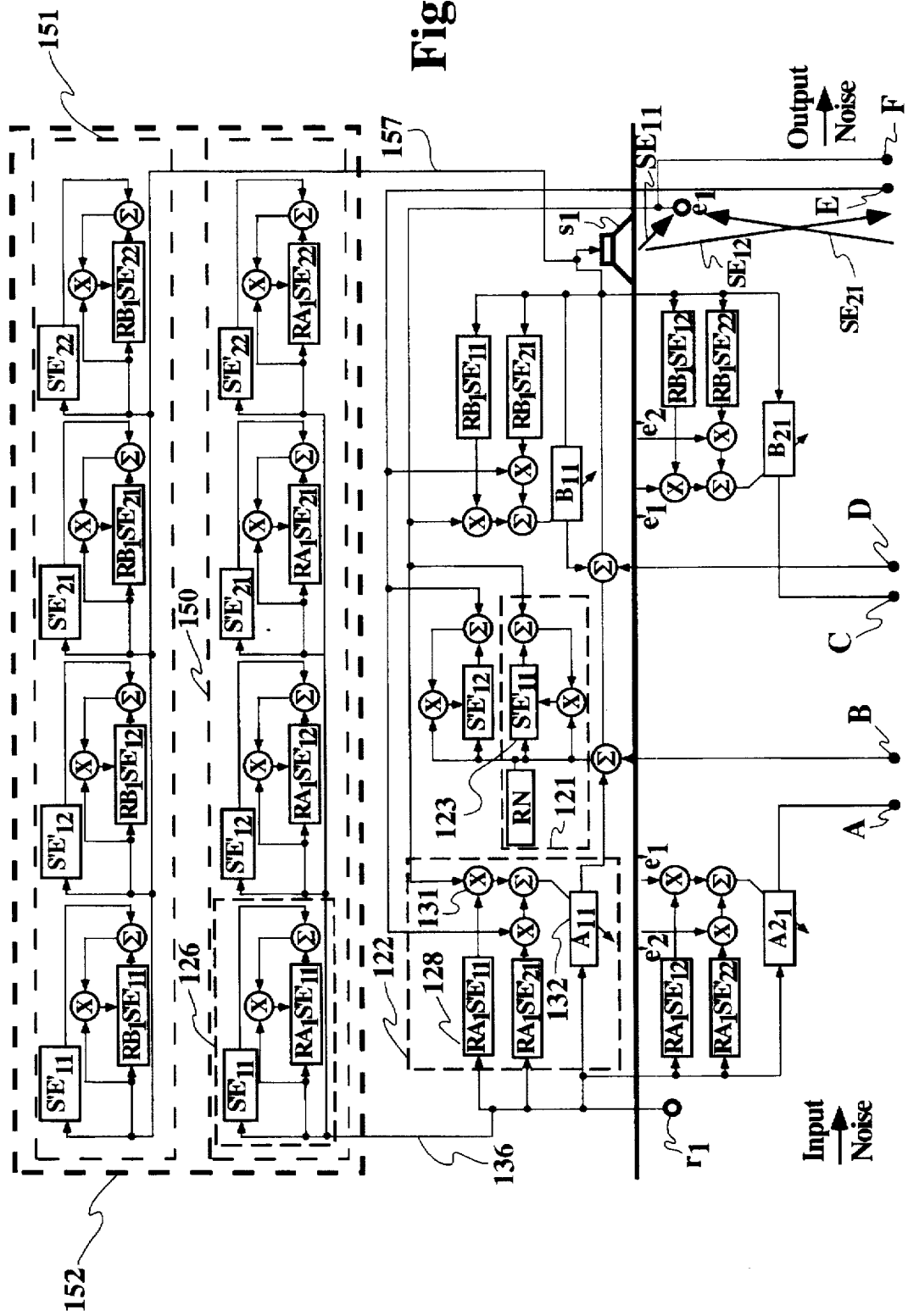
FIG. 5 is an illustration of half a MIMO active attenuation system including on-line reduction for determining the reduced filter models in a feed-forward control system.
Figure 5B:
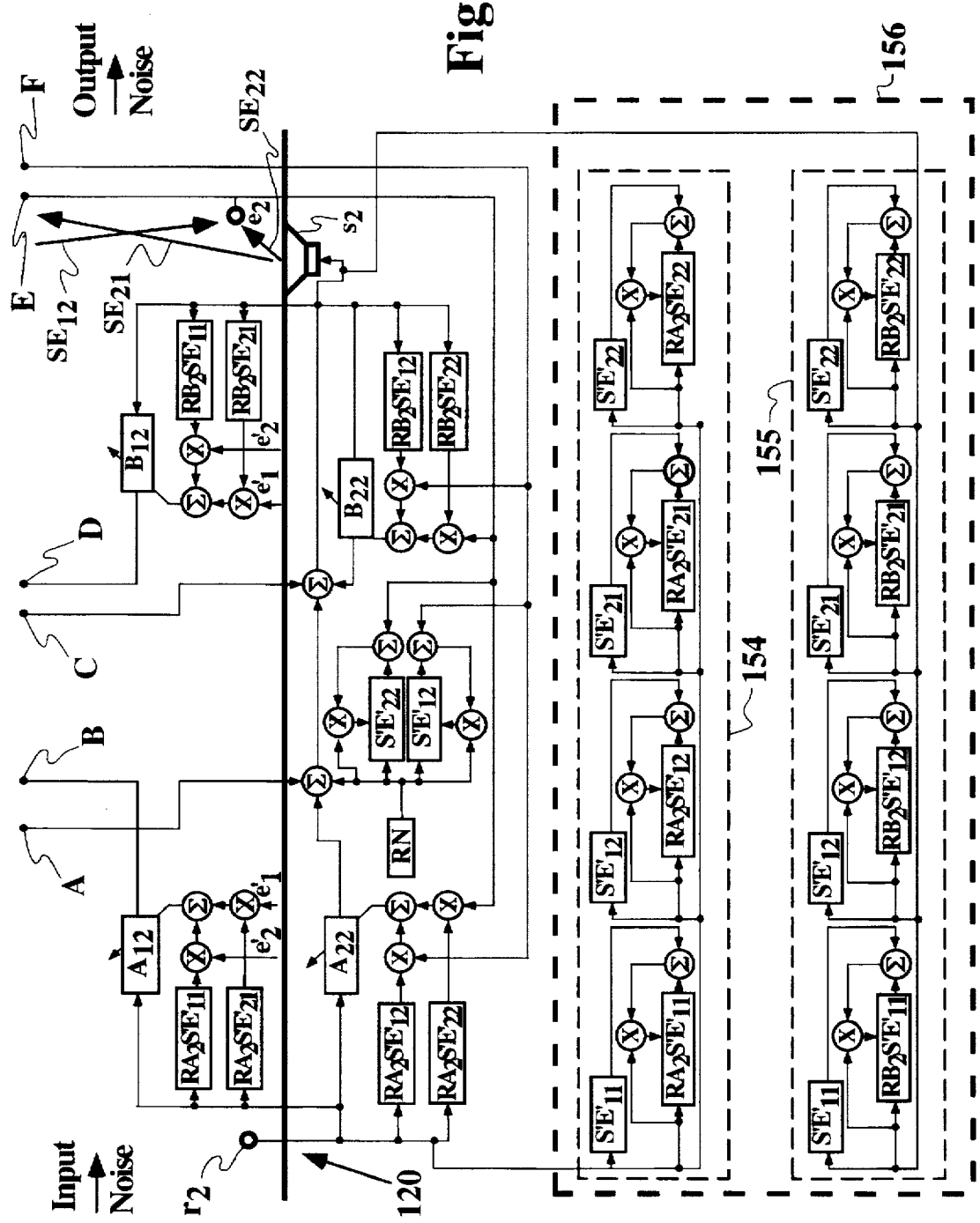

FIG. 5a and 5b illustrates the present invention reduction method for transforming the long filter model into a reduced filter model is also applicable in a MIMO system 120. The description of this complex multi-channel system will reference only portions of the diagram, as much of the diagram is symmetric and duplicative. Like reference numerals have been utilized to signify like components as compared to the FIGS. 3, 4A, and 4B embodiments. The Figures of FIG. 5a and FIG. 5b are connected at points indicated by A, B, C, D, E, and F. In the FIG. 5a and 5b MIMO embodiment, each of the S'E' models is an estimate for the actual frequency response indicated as $SE_{11}$, $SE_{12}$, $SE_{21}$, and $SE_{22}$. For example, the $SE_{11}$ nomenclature used is indicative of the frequency response between the first output device S and the first error sensor $e_1$. Further, the numeral 1 or 2 following RA indicates the sensor $r_1$ for subscript 1 and $r_2$ for subscript 2. The numeral 1 or 2 following RB indicates actuator $s_1$ for subscript 1 and $s_2$ for subscript 2. Output device $s_1$ may take the form of an actuator, speaker or other cancellation device.

In a MIMO system of FIG. 5a and 5b the reduction method includes obtaining at least one input signal such as $r_1$ as is present in line 136 indicative of characteristics of at least one source of disturbance such as an input noise. Further, at least one error signal such as $e'_1$ indicative of at least one residual disturbance (such as output noise) at least one location is extracted. The active system 120 also includes at least one output device such as $s_1$. The at least one input signal at 136 is input into at least one control filter 132 within an update model 122. The control filters are denoted as $A_{11}$, $A_{21}$, $A_{12}$ and $A_{22}$, and $B_{11}$, $B_{21}$, $B_{12}$ and $B_{22}$. The at least one control filter 132 generates at least one control signal. The at least one control filter 132 also has a plurality of control filter weights which are adaptively updated by an update-calculation method such as at 131. Again, the preferred method is filtered-x LMS or the like.

At least one long filter model 123 such as $S'E'_{11}$ may be determined in an on-line fashion by on-line identification block 121 which represents at least one frequency response of said system. This may be also be accomplished by off-line identification or pre-training. The at least one long filter model 123 which has a length of K is then transformed into at least one shortened or reduced filter model 128, such as $RA_1 S'E'_{11}$ which has a length of M, where M is less than K.

In particular, it is preferable that $2L \leq M < K$. This is true of MIMO and SISO systems.

The transformation for the $S'E'_{11}$ long filter model as it relates to $r_1$ takes place in reduction block 126. The reduction method used is identical to that described in relation to the FIG. 3 embodiment. Upon convergence of the reduction model in block 126, the reduced model is copied to the update model 122 to be used in the update process for updating the $A_{11}$ control filter 132. The reduction method is also performed for the remainder of the frequency response models $S'E'_{12}$, $S'E'_{21}$, and $S'E'_{22}$ as they relate to $r_1$. This occurs in upper A reduction Block 150 within upper reduction block 152. The reduction of the B Filter models relating to actuator $s_1$ is required in MIMO systems. These reductions take place in the Upper B reduction block 151 within upper reduction block 152 using input signal 157. Likewise, the reductions relating to sensor $r_2$ take place in Lower A reduction block 154 and Lower B reduction block 155 in lower reduction block 156. MIMO systems, which use the reduction techniques of the present invention are particularly useful for tonal cancellation systems where the multiple tones are to be canceled. By way of example and not by limitation, the system may include four or less dominant tones to be canceled. Upon generating the at least one shortened filter model 128, at least one input signal $r_1$ is input into said at least one shortened filter model 128 to generate at least one shortened filter output.

Next, the control filter weights of said at least one control filter 132 are calculated according to said update-calculation method based upon said at least one shortened filter output and said at least one error signal. Finally, at least one output device, such as speaker $s_1$ is driven responsive to said at least one control signal in order to reduce at least one of vibration and sound at said at least one location, such as within the duct shown.

It should be understood that this reduction method has applicability to MIMO systems where mechanical vibration is attempted to be controlled at a defined location by use of active mounts, actuators or the like.

While several embodiments of the present invention have been described in detail, various modifications, alterations, changes and adaptations to the aforementioned may be made without departing from the spirit and scope of the present invention defined in the appended claims. It is intended that all such modifications, alterations, changes and adaptations be considered part of the present invention.

What is claimed is:

1. A method of reducing the computational burden of an active system, comprising the steps of:
   (a) obtaining an input signal indicative of characteristics of a source of disturbance, said input signal having dominant tones present therein to be canceled;
   (b) extracting an error signal indicative of a residual disturbance at a selected location;
   (c) inputting said input signal into an update model having a control filter for generating a control signal, said control filter having a plurality of control filter weights which are adaptively updated according to an update calculation method;
   (d) determining coefficients of a long filter model which represents a frequency response of said system;
   (e) transforming said long filter model into a shortened filter model;
   (f) inputting said input signal into said shortened filter model to generate a shortened filter output;
   (g) adaptively calculating said control filter weights of said control filter according to said update calculation method based upon said shortened filter output and said error signal; and (h) driving an output device responsive to said control signal in order to reduce at least one of vibration and sound at said selected location.

2. A method of claim 1 wherein updating of said long filter model is accomplished in on-line fashion in an on-line identification block.

3. A method of claim 1 wherein said input signal in a feed forward system is provided by a reference sensor which is at least one of a microphone, accelerometer, force transducer, and tachometer.

4. A method of claim 1 wherein said error signal is provided by an error sensor which is at least one of a microphone, accelerometer, and force transducer.

5. A method of claim 1 wherein said output device is at least one of a loudspeaker, inertial actuator, active mounting, and electro-mechanical actuator.

6. A method of claim 1 wherein said method is used to control two to four dominant tones in a turbofan aircraft and to control four to eight dominant tones in a turboprop aircraft.

7. A method of claim 1 wherein said short filter model is obtained on-line in a reduction block.

8. A method of claim 1 wherein said shortened filter model is calculated using a pseudo matrix inversion method.

9. A method of claim 1 wherein a gradient descent method is used for providing an update calculation which is a filtered-x LMS algorithm.

10. A feed-forward control apparatus for active control, comprising:

(a) a reference sensor for sensing a source of input disturbance and providing an input signal indicative of said input disturbance, said input disturbance causing at least one of a vibration and noise to occur within a control volume;

(b) an output device for providing a canceling output for locally canceling said at least one of said vibration and noise;

(c) an error sensor for sensing a residual combination of at least one of noise and vibration due to said canceling output and said input disturbance and providing a residual error signal;

(d) a control filter model for transforming said input signal into a canceling output, said control filter including a plurality of control filter weights;

(e) a long filter model for providing an frequency response estimate; and (f) means for shortening said long filter model into a short filter model such that said short filter model has a smaller number of coefficients that match the frequency response of a plant at a finite number of disturbance frequencies, said smaller number of coefficients used in an update calculation for adaptively updating said control filter weights of said control filter.

11. A method of reducing the computational burden of an active system, comprising the steps of:

(a) extracting at least one input signal indicative of characteristics of at least one source of disturbance;

(b) extracting at least one error signal indicative of at least one residual disturbance at least one location;

(c) inputting said at least one input signal into at least one control filter for generating at least one control signal, said at least one control filter having a plurality of control filter weights which are adaptively updated according to an update calculation method;

(d) determining coefficients of at least one long filter model which represents at least one frequency response of said system;

(e) transforming said at least one long filter model into at least one shortened filter model;

(f) inputting said at least one input signal into said at least one shortened filter model to generate at least one shortened filter output;

(g) adaptively calculating said control filter weights of said at least one control filter according to said update calculation method based upon said at least one shortened filter output and said at least one error signal; and (h) driving at least one output device responsive to said at least one control signal in order to reduce at least one of vibration and sound at said at least one location.

12. A method of claim 11 wherein said method includes extracting a plurality of input signals, extracting a plurality of error signals, and driving a plurality of output devices in a MIMO system.

13. A method of reducing the computational burden of an active system, comprising the steps of:

(a) obtaining an input signal indicative of characteristics of a source of disturbance, said input signal having dominant tones present therein;

(b) obtaining an error signal indicative of a residual disturbance at a selected location;

(c) inputting said input signal into an update model having at least one control filter therein for generating a control signal, said at least one control filter having a plurality of control filter weights which are adaptively updated according to an update calculation method;

(d) determining a long filter model which represents a frequency response of said system, said long filter model being obtained in one selected from an on-line and off-line fashion;

(e) transforming said long filter model into a reduced filter model within a reduction block;

(f) inputting said input signal into said reduced filter model to generate a reduced filter output within said update model;

(g) adaptively calculating said control filter weights of said control filter within said update model according to said update calculation method based upon said shortened filter output and said error signal; and (h) driving an output device responsive to said control signal in order to reduce at least one of vibration and sound.

14. A method of claim 13 further including using said output signal as an input to a B reduction block for reducing said long filter model within said B reduction block to produce a reduced filter model to be used in updating a B filter within a MIMO system.

15. A method of claim 13 further including using said input signal as an input to an A reduction block for reducing said long filter model within said A reduction block to produce a reduced filter model to be used in updating an A filter and using said output signal as an input to a B reduction block for reducing said long filter model within said B reduction block to produce a reduced filter model to be used in updating a B filter in a MIMO system.

16. In an active control system utilizing a gradient descent algorithm, a method of reducing computational burden, comprising the method steps of:

(a) extracting at least one signal from a group consisting of an input signal indicative of an input disturbance and an error signal indicative of a residual disturbance at a location;

(b) extracting a long filter model $B_K$ which is an estimate of a plant;

(c) generating a $[H_{J,K}]$ matrix;

(d) extracting a $[H_{J,M}]$ matrix from said $[H_{J,K}]$ matrix;

(e) completing an inverse of said $[H_{J,M}]$ matrix denoted as $[H_{J,M}{}^+]$;

(f) calculating a shortened filter model $D_M$ according to the relationship:

$$D_M = [H_{J,M}{}^+] * [H_{J,K}] * B_K;$$

(g) inputting said at least one signal to said shortened filter model $D_M$ to generate a shortened filter output;

(h) adaptively calculating control filter weights of an adaptive control filter according to a gradient descent update method based upon said shortened filter output from said shortened filter model $D_M$ and said error signal;

(i) inputting said at least one signal to said control filter for generating a control signal; and (j) driving an output device responsive to said control signal in order to reduce at least one from a group consisting of sound and vibration at said location.

17. A method of claim 16 wherein said calculation of said shortened filter model $D_M$ is accomplished in an on-line fashion in a reduction block.

18. A method of claim 16 wherein said gradient descent update method for providing said update calculation is a filtered-x LMS algorithm.

19. A method of claim 16 wherein said active control system is one of a feed-forward control system and a feed-back type control system.

20. A method of claim 16 wherein said method is used in a feed-forward control system further including a waveform generator.

* * * * *